United States Patent
Gehmlich et al.

(10) Patent No.: US 12,497,710 B2
(45) Date of Patent: Dec. 16, 2025

(54) METHOD FOR PRODUCING SEMICONDUCTOR WAFERS

(71) Applicant: SILTRONIC AG, Munich (DE)

(72) Inventors: Michael Gehmlich, Weissenborn (DE); Gudrun Kissinger, Lebus (DE); Karl Mangelberger, Ach (AT); Timo Mueller, Burghausen (DE); Michael Skrobanek, Freiberg (DE)

(73) Assignee: Siltronic AG, Munich (DE)

( * ) Notice: Subject to any disclaimer, the term of this patent is extended or adjusted under 35 U.S.C. 154(b) by 543 days.

(21) Appl. No.: 18/001,807

(22) PCT Filed: Jun. 10, 2021

(86) PCT No.: PCT/EP2021/065639
§ 371 (c)(1),
(2) Date: Dec. 14, 2022

(87) PCT Pub. No.: WO2021/259657
PCT Pub. Date: Dec. 30, 2021

(65) Prior Publication Data
US 2023/0243069 A1    Aug. 3, 2023

(30) Foreign Application Priority Data

Jun. 23, 2020   (EP) .................... 20181650

(51) Int. Cl.
*H01L 21/322*   (2006.01)
*C30B 1/00*     (2006.01)
(Continued)

(52) U.S. Cl.
CPC ............. *C30B 33/02* (2013.01); *C30B 1/00* (2013.01); *C30B 15/20* (2013.01); *C30B 29/06* (2013.01);
(Continued)

(58) Field of Classification Search
CPC ......... C30B 33/02; C30B 15/20; C30B 29/06; C30B 29/02; H01L 21/324; H01L 21/3221; H01L 21/3225
See application file for complete search history.

(56) References Cited

U.S. PATENT DOCUMENTS 9,230,798 B2    1/2016   Mueller et al.
9,458,554 B2 *  10/2016  Mueller ............... C30B 15/203
(Continued)

FOREIGN PATENT DOCUMENTS

DE    102014208815 A1    11/2015
DE    102016225138 A1     6/2018
(Continued)

OTHER PUBLICATIONS

Timo Mueller et al., "Near-Surface Defect Control by Vacancy Injecting/Out-Diffusing Rapid Thermal Annealing," Phys. Status Solidi A 2019.

*Primary Examiner* — Yara B Green
*Assistant Examiner* — Benjamin Michael Kupp
(74) *Attorney, Agent, or Firm* — BROOKS KUSHMAN P.C.

(57) ABSTRACT

A semiconductor single-crystal silicon, is produced from a silicon substrate wafer containing interstitial oxygen in a concentration of more than $5 \times 10^{16}$ AT/cm³ (new ASTM) by an RTA treatment of the wafer in a first heat treatment at a first temperature in a temperature range of not less than 1200° C. and not more than 1260° C. for a period of not less than 5 s and not more than 30 s, where the front side of the substrate wafer is exposed to an atmosphere containing argon;
a second heat treatment at a second temperature in a temperature range of not less than 1150° C. and not more than 1190° C. for a period of not less than 15 s and
(Continued)

not more than 20 s, where the front side of the wafer is exposed to an argon and ammonia, atmosphere, and a third heat treatment at a third temperature in a temperature range of not less than 1160° C. and not more than 1190° C. for a period of not less than 20 s and not more than 30 s, where the front side of the wafer is exposed to an atmosphere containing argon.

13 Claims, 2 Drawing Sheets

(51) Int. Cl.
*C30B 15/20* (2006.01)
*C30B 29/06* (2006.01)
*C30B 33/02* (2006.01)
*H01L 21/324* (2006.01)

(52) U.S. Cl.
CPC ........ *H01L 21/3225* (2013.01); *H01L 21/324* (2013.01)

(56) References Cited

U.S. PATENT DOCUMENTS

| | | | |
|---|---|---|---|
| 10,961,640 | B2 | 3/2021 | Mueller et al. |
| 2002/0170631 | A1 | 11/2002 | Falster et al. |
| 2012/0043644 | A1 | 2/2012 | Ono |
| 2014/0044945 | A1 | 2/2014 | Mueller et al. |
| 2017/0253995 | A1 | 9/2017 | Qu et al. |
| 2022/0195620 | A1 | 6/2022 | Qu et al. |
| 2022/0349089 | A1 | 11/2022 | Mueller et al. |

FOREIGN PATENT DOCUMENTS

| | | | |
|---|---|---|---|
| DE | 102017219255 | A1 | 5/2019 |
| EP | 1887110 | A1 | 2/2008 |
| JP | 2010228931 | A | 10/2010 |
| TW | I539041 | B | 6/2016 |
| TW | I628320 | B | 7/2018 |
| TW | 202041726 | A | 11/2020 |
| WO | 98/45508 | A1 | 10/1998 |
| WO | 2018108735 | A1 | 6/2018 |

* cited by examiner

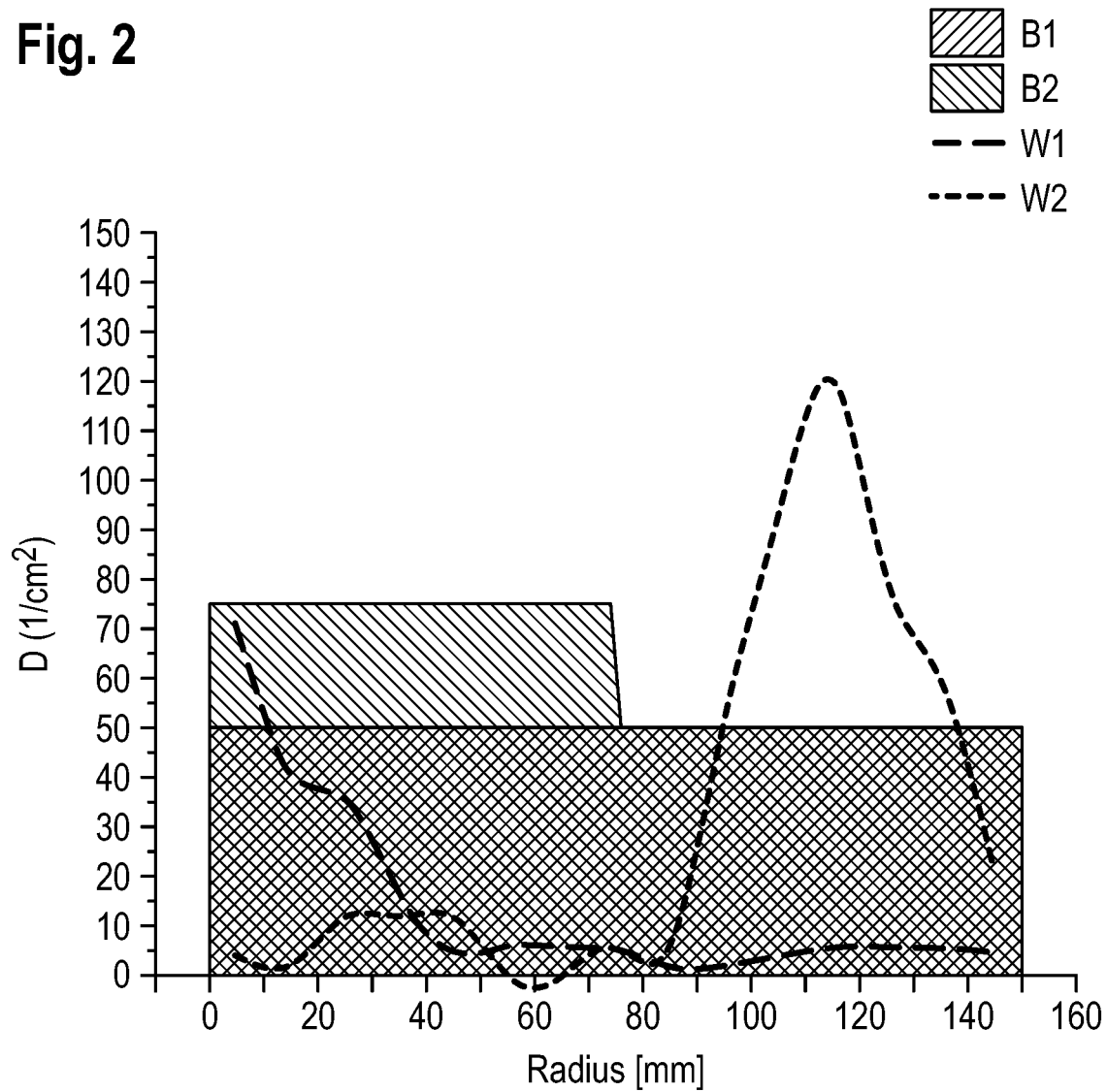

METHOD FOR PRODUCING SEMICONDUCTOR WAFERS

CROSS REFERENCE TO RELATED APPLICATIONS

This application is the U.S. National Phase of PCT Appln. No. PCT/EP2021/065639 filed Jun. 10, 2021, which claims priority to European Application No. 20181650.1 filed Jun. 23, 2020, the disclosures of which are incorporated in their entirety by reference herein.

BACKGROUND OF THE INVENTION

1. Field of the Invention

The present invention provides a process for producing a semiconductor wafer of single-crystal silicon comprising a high-temperature step.

2. Description of the Related Art

Monocrystalline semiconductor wafers are the basis of modern electronics. Producing components on these semiconductor wafers comprises performing thermal processes which nowadays comprise relatively complex coating steps.

Semiconductor wafers are typically obtained by cutting slices out of a single crystal using an internal diameter saw or multi-wire saw (MWS) and subsequently performing grinding and/or polishing steps and optionally an epitaxy step.

When the single crystal from which the semiconductor wafer originates is pulled according to the Czochralski method (CZ method) from a melt contained in a quartz crucible, the crucible material forms the source of interstitial oxygen incorporated into the single crystal and the semiconductor wafer derived therefrom. The concentration of interstitial oxygen incorporated may be controlled fairly precisely, for example by controlling the pressure and the flow of argon through the pulling apparatus or by tuning crucible and seed crystal rotation during the pulling of the single crystal or by employing a magnetic field which is applied to the melt or by a combination of these measures. The measured interstitial oxygen concentration is generally not less than $5 \times 10^{16}$ AT/cm$^3$ (new ASTM) in crystals produced by the CZ method.

Also of particular importance during the pulling of a single crystal of silicon by the CZ method is the control of the ratio v/G of pulling velocity v and axial temperature gradient G at the crystallization interface. The pulling velocity v is the velocity at which the growing single crystal is lifted upward away from the melt and the axial temperature gradient G is a measure of the change in temperature at the crystallization interface in the direction of the crystal lifting. The type and concentration of point defects (vacancies and interstitial silicon atoms) that dominate in the single crystal are substantially determined by the v/G quotient.

BMDs can be developed particularly in a region in which the number of vacancies exceeds the number of interstitial silicon atoms and in which vacancies therefore dominate. When there is a relatively large supersaturation of vacancies present during crystallization of the single crystal, which is the case for a relatively high v/G quotient, the vacancies form agglomerates which can be verified for example as COPs (Crystal Originated Particles). When v/G and thus the supersaturation of the vacancies is somewhat lower than would be necessary for formation of COPs, seeds of OSF defects (Oxidation Induced Stacking Faults) form instead of COPs. In this case the single crystal crystallizes in the OSF region. When the v/G quotient is smaller still, a region in which vacancies still dominate but which is classed as defect-free because COPs and OSFs are not formed therein is formed during crystallization of the single crystal. Such a region is referred to as a $P_v$ region. Further reduction of the v/G quotient causes the single crystal to grow in the $P_i$ region which is likewise classed as defect-free but in which interstitial silicon atoms dominate.

The axial temperature gradient G at the crystallization interface and the radial progression thereof are determined by the heat transport from and to the crystallization interface. The heat transport is in turn substantially influenced by the thermal properties of the environment of the growing single crystal, the so-called "hot zone", and by the supply of heat through one or more heating apparatuses.

When it has been decided to pull a single crystal in a certain hot zone, the axial and radial progression of the axial temperature gradient G at the crystallization interface may be determined by means of simulation calculations which take into account the heat balance. Appropriate configuration of the hot zone can also ensure that the axial temperature gradient G has a desired progression along the radius of the single crystal. As a result of the growth of the single crystal and the reduction in the volume of the melt, the thermal conditions and thus also the axial progression of the axial temperature gradient G at the crystallization interface change over time. To keep the v/G quotient in an intended region in the axial direction too it is thus necessary to compensate for the change over time in the axial temperature gradient G through a corresponding change in the pulling velocity v.

Controlling the pulling velocity v thus also makes it possible to control the v/G quotient.

WO 98/45508 A1 is one of numerous publications which describe how the progression of the pulling velocity v over time can be experimentally determined in order to achieve through control of the pulling velocity v the condition that the v/G quotient remains virtually unchanged during the growth of the single crystal and the single crystal can grow in an intended region. This document further describes verification methods for characterization and differentiation of a $P_v$ region and a $P_i$ region.

Interstitial oxygen in the crystal plays an important role in the formation of BMD defects (BMDs, Bulk Micro Defects). BMDs are oxygen precipitates into which BMD seeds grow in the course of a heat treatment. They act as internal getters, i.e. as energy sinks for impurities, and are therefore fundamentally advantageous. One exception is their presence at locations where the intention is to accommodate electronic components. To avoid the formation of BMDs at such locations, an epitaxial layer may for example be deposited on the semiconductor wafer and provision made to accommodate the electronic components in the epitaxial layer. However, the semiconductor wafer may also be subjected to a thermal treatment so that interstitial oxygen diffuses to the surface of the semiconductor wafer and thus cannot form BMDs in the near-surface region. This region is referred to as a "denuded zone".

A denuded zone is accordingly a region of the semiconductor wafer which extends from the front side in the direction of the back side over a certain depth and in which BMDs cannot be formed.

Adjacent to the denuded zone is a region which extends further into the interior (bulk) of the semiconductor wafer and contains BMD seeds.

It is known that the presence of vacancies in the single crystal is advantageous when relatively high densities of BMDs are sought. US 2002/0170631 A1 describes a process for producing a semiconductor wafer of single-crystal silicon with a deep denuded zone. The process comprises a heat treatment (RTA treatment, rapid thermal anneal) of the semiconductor wafer which includes a short-duration rapid heating and cooling of the semiconductor wafer. The RTA treatment is to be performed in an atmosphere containing oxygen in a concentration of not less than 100 ppma and not more than 10,000 ppma. The described process is moreover conceived so as to form a concentration profile of vacancies in which the peak density of vacancies is achieved in the middle between the front side and the back side of the semiconductor wafer or near to the middle. Since the concentration profiles of the vacancies, of the BMD seeds and of the BMDs correlate, the peak density of BMDs is likewise found in the middle or near to the middle.

EP 1 887 110 A1 describes the production of a semiconductor wafer which is made of single-crystal silicon, comprises oxygen, nitrogen and hydrogen and originates from a single crystal pulled in the $P_v$ region. It is reported that the presence of nitrogen and to a lesser extent that of hydrogen makes it possible to be able to utilize a larger range of pulling velocities in order to be able to crystallize the single crystal in the $P_v$ region. It is further proposed to choose a relatively high concentration of interstitial oxygen in the semiconductor wafer and to subject the semiconductor wafer to a heat treatment by RTA.

Patent specification DE 10 2017 219 255 A1 describes a process for producing semiconductor wafers which includes two RTA treatments. The semiconductor wafers produced in this way exhibit a denuded zone of not less than 30 μm and comprise BMD seeds that may be developed into BMDs having a density at a distance of at least 120 μm from the front side of the semiconductor wafer of not less than $3 \times 10^9$ cm$^{-3}$.

The scientific publication by Müller et al. (T. Müller et al., "Near-Surface Defect Control by Vacancy Injecting/Out-Diffusing Rapid thermal Annealing", Phys. Status Solidi A, 2019, 1900325) describes the effect of different atmospheres during RTA steps at different temperatures on crystal defects.

Patent specification DE 10 2016 225 138 A1 discloses a process containing three RTA steps, wherein an etching step suitable for removing an oxide of the surface of the semiconductor wafer is performed between the first two RTA steps.

The process proposed therein has disadvantages. The necessary etching step to remove the oxide layer that forms during the first RTA step is costly and constitutes an additional risk of contamination of the semiconductor wafers. In addition, the proposed process places elevated requirements on the employed material since the rod used for the semiconductor wafers must lie completely in the $P_v$ region. Rod parts which do not meet these requirements must be discarded.

When the substrate employed for the proposed process comprises not only a $P_v$ region but also a $P_i$-region it is found that the radial homogeneity of the properties of the semiconductor wafer no longer meet the requirements.

When the employed substrate contains a region in which small COPs are detectable, this results in the problem that the radial homogeneity is insufficient for the desired properties of the semiconductor wafer. The same applies to the case where it additionally contains both a $P_i$ region and a region in which smaller COPs are detectable.

The abovementioned disadvantages are decisive factors in making the process for pulling a single crystal necessary for obtaining the substrate relatively complex and thus relatively costly.

It is accordingly an object of the present invention to provide an alternative process which does not have the disadvantages of the process recited in DE 10 2016 225 138 A1 but at the same time brings about at least the same properties as the described semiconductor wafer.

SUMMARY OF THE INVENTION

These objects and others are achieved by a process for producing a semiconductor wafer of single-crystal silicon, comprising providing a substrate wafer of single-crystal silicon which contains interstitial oxygen in a concentration of more than $5 \times 10^{16}$ AT/cm$^3$ (new ASTM); treating the substrate wafer by RTA in a first heat treatment at a first temperature in a temperature range of not less than 1200° C. and not more than 1260° C. for a period of not less than 5 s and not more than 30 s, wherein a front side of the substrate wafer is exposed to an atmosphere containing argon, a second heat treatment at a second temperature in a temperature range of not less than 1150° C. and not more than 1190° C. for a period of not less than 15 s and not more than 20 s, wherein the front side of the substrate wafer is exposed to an atmosphere containing argon and ammonia, and a third heat treatment at a third temperature in a temperature range of not less than 1160° C. and not more than 1190° C. for a period of not less than 20 s and not more than 30 s, wherein a front side of the substrate wafer is exposed to an atmosphere containing argon.

BRIEF DESCRIPTION OF THE DRAWINGS

FIG. 2 shows the radial distribution of the defects after thermal treatment of a test wafer. The regions B1 and B2 show the regions preferred for the invention in which a test wafer must be located to be suitable for the thermal process. W1 and W2 show radial defect densities of two different test wafers, wherein W1 meets the requirements and W2 does not.

DETAILED DESCRIPTION OF THE PREFERRED EMBODIMENTS

Figure 1:
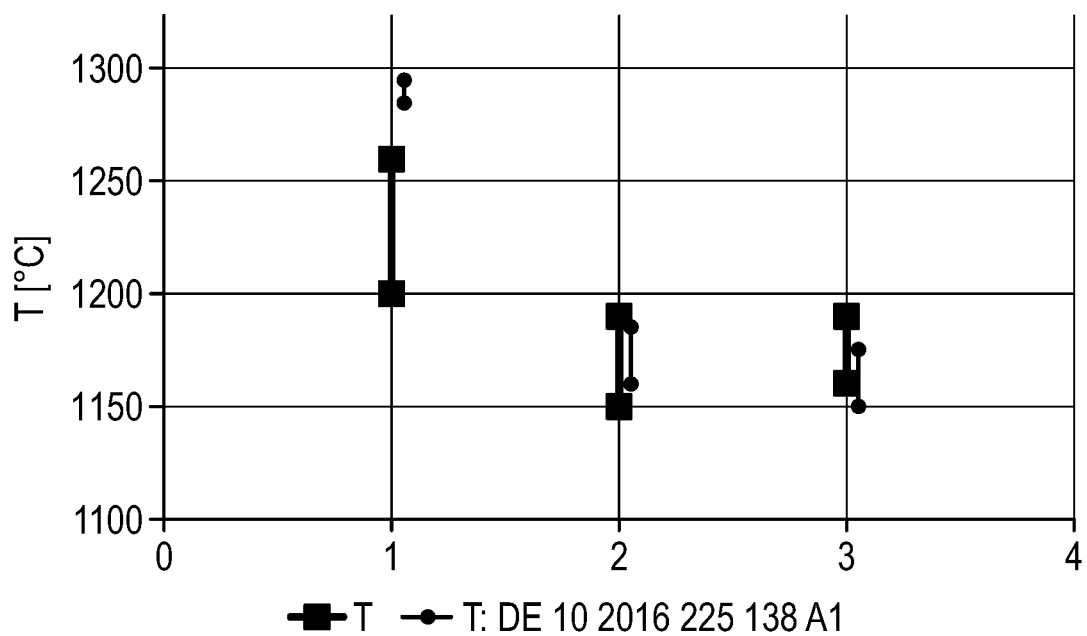
FIG. 1 shows the temperature range of the respective $i^{th}$ RTA step, wherein the abscissa shows the index i of the particular RTA step. T describes the individual temperatures of the process according to the invention while in comparison T: DE 10 2016 225 138 A1 shows the temperatures of a prior art process.

Producing a semiconductor wafer of single-crystal silicon according to the invention comprises growing a single crystal by the CZ method, cutting-to-size crystal pieces and producing at least one test wafer from the respective crystal piece, cutting substrate wafers from a crystal piece and further processing the substrate wafers to afford semiconductor wafers.

One property of the substrate wafers thus obtained which is essential to the invention is that oxygen is present in a concentration of more than $5 \times 10^{16}$ At/cm$^3$ (new ASTM). It is not absolutely necessary to use the CZ method.

The further processing of the substrate wafers to afford semiconductor wafers preferably comprises mechanically processing the substrate wafers cut from the single crystal by lapping and/or grinding, removing near-surface damaged crystal regions by etching and pre-cleaning the substrate wafers in SC1 solution, SC2 solution and ozone.

During growth of the single crystal the melt is preferably subjected to a magnetic field, most preferably a horizontal magnetic field or a CUSP magnetic field. The quotient v/G of pulling velocity v and axial temperature gradient G at the phase interface is controlled such that the semiconductor wafer of single-crystal silicon obtained by further processing the single crystal either consists completely of $P_i$ region or additionally contains a $P_v$ region.

The pulling velocity v during growing of the single crystal is preferably not less than 0.45 mm/min provided the intention is to produce semiconductor wafers having a diameter of 300 mm.

The optimal pulling velocity during pulling may be found by varying the pulling velocity of a crystal piece with increasing length of the crystal. A rectangular wafer (a so-called plank) may be cut out of the thus-obtained crystal piece by means of two longitudinal cuts running along the center of the crystal piece, so that the position on one side of the rectangular wafer corresponds to the employed pulling velocity. Analyzing the wafer makes it possible to precisely assign defect properties to a pulling velocity and thus find the desired pulling velocity.

A single crystal is preferably grown in an atmosphere of argon or, more preferably, in an atmosphere containing argon and hydrogen. The partial pressure of hydrogen is most preferably less than 30 Pa. The partial pressure is here calculated according to Dalton's law assuming an ideal gas. The following equation applies:

$$\frac{n_i}{n_{ges}} = \frac{p_i}{p_{ges}}$$

wherein $n_i$ is the amount of substance of the $i^{th}$ component, $n_{tot}$ is the total amount of substance, $p_{tot}$ is the pressure and $p_i$ is the partial pressure of the $i^{th}$ component.

The substrate wafers of single-crystal silicon obtained from the single crystal have a concentration of oxygen of not less than $4.5 \times 10^{17}$ atoms/cm$^3$ and not more than $5.2 \times 10^{17}$ atoms/cm$^3$ (new ASTM). It is known that the concentration of oxygen in the single crystal may be adjusted during production thereof, for example by controlling the rotational velocity of the crucible and/or of the single crystal and/or by controlling the pressure and/or the flow rate of the gas forming the atmosphere in which the single crystal is grown and/or by controlling the magnetic field strength of the magnetic field to which the melt is subjected.

An IR-LST laser tomograph from SemiLab was employed with a laser output of 50-80 mW and a defect size resolution range of 20 nm-60 nm to determine the defect density on a test wafer. When the measured defect density on the overall test wafer was less than $5 \times 10^4$ 1/cm$^3$ it was assumed that the accompanying crystal piece is free from COPs.

The inventors have recognized that it is particularly advantageous to use substrate wafers that only include oxygen precipitates having a size smaller than 9 nm, preferably smaller than 6 nm. Testing may be undertaken on the substrate by means of TEM (transmission electron microscopy) for example.

The region on the substrate wafer that includes seeds of oxygen precipitates is also referred to as a $P_{bmd}$ region.

As a test for the occurrence of such oxygen precipitates having the described properties the inventors performed the following process.

A test wafer is introduced into an oven (horizontal or vertical) under an $N_2$ atmosphere at 880-920° C. and held therein for 6-10 hours; this is followed by heating to 1080-1120° C. and wet oxidation with $O_2/H_2$ is carried out for a holding time of 1.5-2.5 hours. The test wafer is subsequently cooled under a pure $O_2$ atmosphere. All heating and cooling rates are in the range of 5-10 K/min. The test wafer is then subjected to a Secco etch with a material removal of 5-10 μm and the defects occurring are detected using a radially scanning optical microscope and the density thereof determined.

When the measured defect density over the entire front side of the test wafer is smaller than 50 defects/cm$^2$ it is assumed that any oxygen precipitates present are smaller than 6 nm.

When the measured defect density in a circle on the front side of the test wafer which shares its center with the front side of the test wafer and whose radius is not more than 50 mm is more than 50 defects/cm$^2$ and less than 75 defects/cm$^2$ and on the remainder of the test wafer is less than 50 defects/cm$^2$, it is assumed that the size of any oxygen precipitates present is smaller than 9 nm.

By way of example experimentally determined defect densities of two test wafers W1 and W2 are shown in FIG. 2. Test wafer W1 accordingly meets the requirements and W2 does not.

To determine the size of the oxygen precipitates numerical simulations were performed analogously to the "Müller et al" publication, wherein the boundary conditions were correspondingly adapted.

The inventors have additionally recognized that the substrate wafers preferably comprise a $P_i$ region in which interstitial silicon atoms dominate but do not yet form dislocation loops, i.e. so-called LPITs.

Measurement for any LPITs was carried out by microscopy counting of the defects found on the surface of the substrate wafer after performing initially a bright etch (material removal 70 μm) and subsequently a Secco etch for 16 min.

It is preferable when the substrate wafers additionally have a $P_v$ region in which silicon vacancies dominate but do not form aggregates larger than 10 nm. This region is preferably smaller than 80% of the area of the substrate wafers.

The RTA treatment comprises a first rapid heating of the substrate wafers of single-crystal silicon to a temperature in a temperature range of not less than 1200° C. and not more than 1260° C. and holding the substrate wafers in this temperature range over a period of not less than 5 seconds and not more than 30 seconds. The first heat treatment is performed in an atmosphere containing and preferably consisting of argon.

The subsequent second heat treatment comprises rapid heating of the substrate wafers of single-crystal silicon to a temperature in a temperature range of not less than 1150° C. and not more than 1190° C. and holding the substrate wafers in this temperature range over a period of not less than 15 seconds and not more than 20 seconds in an atmosphere containing argon and ammonia and preferably consisting of argon and ammonia ($NH_3$).

The preferred RTA treatment is shown schematically in FIG. 1.

The volume ratio Ar:$NH_3$ is preferably not less than 10:10 and not more than 10:5, more preferably 10:8. The flow rate of the gas mixture through the RTA oven is preferably not less than 2 slm and not more than 5 slm.

After the second heat treatment in an atmosphere comprising argon and ammonia, the substrate wafer of single-crystal silicon is subjected to a third heat treatment at a temperature in a temperature range of not less than 1160° C. and not more than 1190° C. over a period of not less than 20 seconds and not more than 30 seconds in an inert atmosphere which contains argon and preferably consists of argon.

The composition of the atmosphere is altered during the respective heat treatment and the heat treatment of the substrate wafers continued at constant temperature.

As an alternative it is preferable between the second and the third heat treatment to initially cool the substrate wafers to not less than 600° C., purge the RTA oven with nitrogen until free from ammonia and subsequently bring the substrate wafers to the target temperature of the third heat treatment in an inert atmosphere.

The further treatment of the substrate wafers in the inert atmosphere is of particular importance since this sufficiently reduces the density of vacancies in the region of the denuded zone, thus preventing oxygen precipitates from being able to reform there.

The rapid heating of the substrate wafers of single-crystal silicon in the course of the first and the second heat treatment is carried out from a temperature of 600° C. up to the target temperature preferably at a rate of temperature increase of not less than 15 K/s, more preferably not less than 25 K/s.

In contrast to the conventional teaching (Müller et al.) that a low concentration (for example 1% $O_2$) of oxygen in the atmosphere for the first heat treatment step is necessary to dissolve oxygen precipitates close to the surface (denuded zone), a deleterious effect in the absence of oxygen during the first heat treatment was surprisingly not observed.

It is advantageous when the time elapsing between the beginning of the first heat treatment and the end of the last heat treatment is not more than 320 seconds. The beginning and the end of the heat treatment are to be understood as the time at which the substrate wafer achieves a temperature of 600° C.

After RTA treatment the substrate wafer of single-crystal silicon is polished, preferably by DSP (double-sided polishing), i.e. by simultaneous polishing of the upper and lower side surface followed by polishing of a notch on the substrate wafers and polishing of an edge of the substrate wafer. It is typically the region of the upper side surface, the front side of the thus obtained semiconductor wafer, that is used for constructing electronic components and therefore a final polishing of the front side by CMP (chemical mechanical polishing) is particularly preferred. The polished semiconductor wafer is then preferably subjected to final cleaning and drying.

A semiconductor wafer of single-crystal silicon produced according to the above-described process is particularly suitable for producing electronic components with NAND logic, including under conditions which provide a relatively small thermal budget. Requirements for this suitability include a denuded zone which is relatively deep, a high dielectric strength of a gate oxide produced on the semiconductor wafer and the ability to form a high density of BMDs in the inner region of the semiconductor wafer despite a comparatively low concentration of oxygen and despite an available thermal budget for producing the BMDs which is comparatively low.

The invention claimed is:

1. A process for producing a semiconductor wafer of single-crystal silicon, comprising:
   providing a substrate wafer of single-crystal silicon containing interstitial oxygen in a concentration of more than $5\times10^{16}$ AT/cm$^3$ (new ASTM);
   treating of the substrate wafer by RTA in a first heat treatment at a first temperature in a temperature range of not less than 1200° C. and not more than 1260° C. for a period of not less than 5 s and not more than 30 s, during which a front side of the substrate wafer is exposed to an atmosphere containing argon,
   treating the substrate wafer in a second heat treatment at a second temperature in a temperature range of not less than 1150° C. and not more than 1190° C. for a period of not less than 15 s and not more than 20 s, during which the front side of the substrate wafer is exposed to an atmosphere containing argon and ammonia, and
   treating the substrate wafer in a third heat treatment at a third temperature in a temperature range of not less than 1160° C. and not more than 1190° C. for a period of not less than 20 s and not more than 30 s, during which the front side of the substrate wafer is exposed to an atmosphere containing argon.

2. The process of claim 1, wherein the time between the beginning of the first heat treatment and the end of the third heat treatment is not more than 320 s.

3. The process of claim 1, wherein the minimum temperature of the substrate wafer both between the first and the second heat treatment and between the second and the third heat treatment is not less than 600° C.

4. The process of claim 3, wherein the minimum temperature of the substrate wafer both between the first and the second heat treatment and between the second and the third heat treatment is not less than 750° C.

5. The process of claim 1, wherein the atmosphere in the second heat treatment contains not less than 40% and not more than 60% $NH_3$.

6. The process of claim 1, wherein the substrate wafer has a concentration of interstitial oxygen of not less than $4.5\times10^{17}$ atoms/cm$^3$ (new ASTM) and not more than $5.2\times10^{17}$ atoms/cm$^3$ (new ASTM).

7. The process of claim 1, wherein the substrate wafer was obtained from a silicon crystal produced by a Czochralski pulling process, wherein during the pulling the partial pressure of $H_2$ in the atmosphere in the pulling apparatus does not fall below 20 Pa.

8. The process of claim 7, wherein the partial pressure of $H_2$ is not more than 50 Pa.

9. The process of claim 1, wherein the substrate wafer has a $P_i$ region in which interstitial silicon atoms dominate.

10. The process of claim 9, wherein the substrate wafer contains a $P_v$ region having a size of less than 30% of the substrate wafer in which silicon vacancies dominate.

11. The process of claim 10, wherein the $P_v$ region contains a $P_{bmd}$ region in which oxygen precipitates present have a size of not more than 9 nm.

12. The process of claim 10, wherein the $P_v$ region contains a $P_{bmd}$ region in which oxygen precipitates present have a size of not more than 6 nm.

13. The process of claim 1, wherein the substrate wafer has a diameter of not less than 300 mm.

* * * * *